US010643918B2

(12) United States Patent
Ichimura

(10) Patent No.: US 10,643,918 B2
(45) Date of Patent: May 5, 2020

(54) SEMICONDUCTOR DEVICE

(71) Applicant: Mitsubishi Electric Corporation, Tokyo (JP)

(72) Inventor: Toru Ichimura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/140,132

(22) Filed: Sep. 24, 2018

(65) Prior Publication Data

US 2019/0157177 A1 May 23, 2019

(30) Foreign Application Priority Data

Nov. 22, 2017 (JP) .................... 2017-224442

(51) Int. Cl.
*H01L 23/36* (2006.01)
*H05K 7/20* (2006.01)
(Continued)

(52) U.S. Cl.
CPC .............. *H01L 23/36* (2013.01); *H01L 23/12* (2013.01); *H01L 23/4334* (2013.01); *H01L 23/492* (2013.01); *H01L 23/49555* (2013.01); *H01L 23/50* (2013.01); *H01L 24/46* (2013.01); *H01L 24/49* (2013.01); *H01L 24/85* (2013.01); *H01L 25/072* (2013.01); *H01L 25/105* (2013.01); *H05K 7/20* (2013.01); *H05K 7/209* (2013.01); *H01L 24/48* (2013.01); *H01L 24/73* (2013.01); *H01L 2224/04042* (2013.01); *H01L 2224/32245* (2013.01); *H01L 2224/46* (2013.01);
(Continued)

(58) Field of Classification Search
CPC ....... H01L 23/12; H01L 23/36; H01L 23/492; H01L 24/46; H01L 24/49; H01L 24/85; H01L 25/072; H05K 7/20
See application file for complete search history.

(56) References Cited

U.S. PATENT DOCUMENTS 5,910,885 A * 6/1999 Gulachenski ......... H01L 25/105
257/E25.023
2002/0109211 A1 * 8/2002 Shinohara ........... H01L 23/4334
257/666

(Continued)

FOREIGN PATENT DOCUMENTS

JP 2012-186288 A 9/2012

*Primary Examiner* — Peniel M Gumedzoe
(74) *Attorney, Agent, or Firm* — Studebaker & Brackett PC

(57) ABSTRACT

A semiconductor device includes a printed wiring board; a first semiconductor module including a first package body and a first heat radiation surface on one surface of the first package body, another surface of the first package body, opposite to the first heat radiation surface, faces one face of the printed wiring board; a first heat radiator on the first heat radiation surface; a second semiconductor module including a second package body and a second heat radiation surface on one surface of the second package body, another surface of the second package body, opposite to the second heat radiation surface, faces another face of the printed wiring board; and a second heat radiator provided on the second heat radiation surface. The first and second semiconductor modules are arranged to overlap each other in a plan view. The second semiconductor module is connected in parallel to the first semiconductor module.

13 Claims, 18 Drawing Sheets

(51) Int. Cl.
*H01L 23/492* (2006.01)
*H01L 23/12* (2006.01)
*H01L 23/00* (2006.01)
*H01L 25/07* (2006.01)
*H01L 23/50* (2006.01)
*H01L 23/433* (2006.01)
*H01L 25/10* (2006.01)
*H01L 23/495* (2006.01)

(52) U.S. Cl.
CPC ........... *H01L 2224/48091* (2013.01); *H01L 2224/48137* (2013.01); *H01L 2224/48247* (2013.01); *H01L 2224/4905* (2013.01); *H01L 2224/49175* (2013.01); *H01L 2224/73265* (2013.01); *H01L 2225/107* (2013.01); *H01L 2225/1029* (2013.01); *H01L 2225/1076* (2013.01); *H01L 2225/1094* (2013.01); *H01L 2924/00014* (2013.01); *H01L 2924/10272* (2013.01); *H01L 2924/13055* (2013.01); *H01L 2924/13091* (2013.01); *H01L 2924/1815* (2013.01); *H01L 2924/19107* (2013.01)

(56) References Cited

U.S. PATENT DOCUMENTS

| | | | | |
|---|---|---|---|---|
| 2003/0198022 A1* | 10/2003 | Ye | ............................ | H01L 23/36 |
| | | | | 361/719 |
| 2005/0029634 A1* | 2/2005 | Ambrus | .............. | H01L 23/3107 |
| | | | | 257/666 |
| 2005/0093123 A1* | 5/2005 | Yoshida | .................. | H01L 23/36 |
| | | | | 257/678 |

* cited by examiner

SEMICONDUCTOR DEVICE

BACKGROUND OF THE INVENTION

Field of the Invention

The present invention relates to a semiconductor device.

Description of the Background Art

Power semiconductor modules are required to perform switching control on largest possible power with a low loss, and it is impossible to meet the growing demand from the market by simply reducing a loss per power semiconductor module. Therefore, a power semiconductor device in which a plurality of power semiconductor modules are connected in parallel is used, and the loss caused in each of the semiconductor modules is dispersed. However, in such a power semiconductor device, since it is necessary to radiate the heat generated by the loss from each of the power semiconductor modules, the area of the heat radiation surface must be increased. That is, a power semiconductor device including a plurality of power semiconductor modules causes a cost increase and a size increase.

Japanese Patent Application Laid-Open No. 2012-186288 (Patent Document 1) proposes a power semiconductor device in which a first power chip and a second power chip are disposed to face each other with a gap therebetween and are connected with each other by wires.

Although the power semiconductor device described in Patent Document 1 can be miniaturized, it requires a special support (case or package), resulting in an increase in cost.

SUMMARY

An object of the present specification is to provide a low-cost semiconductor device in which the occupied area is reduced and heat radiation performance is improved.

A semiconductor device according to the present description includes a printed wiring board; a first semiconductor module including a first package body and a first heat radiation surface, the first package body including a first semiconductor element, the first heat radiation surface being provided on one surface of the first package body and configured to radiate heat generated in the first semiconductor element, the first semiconductor module being disposed such that another surface of the first package body, opposite to the first heat radiation surface, faces one face of the printed wiring board; a first heat radiator provided on the first heat radiation surface of the first semiconductor module; a second semiconductor module including a second package body and a second heat radiation surface, the second package body including a second semiconductor element, the second heat radiation surface being provided on one surface of the second package body and configured to radiate heat generated in the second semiconductor element, the second semiconductor module being disposed such that another surface of the second package body, opposite to the second heat radiation surface, faces another face of the printed wiring board; and a second heat radiator provided on the second heat radiation surface of the second semiconductor module. The first semiconductor module and the second semiconductor module are arranged to overlap each other in a plan view. The second semiconductor module is connected in parallel to the first semiconductor module.

According to the present specification, it is possible to provide a low-cost semiconductor device in which the occupied area is reduced and heat radiation performance is improved.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

A semiconductor device according to a first preferred embodiment will be described.

(Device Configuration)

Figure 1:
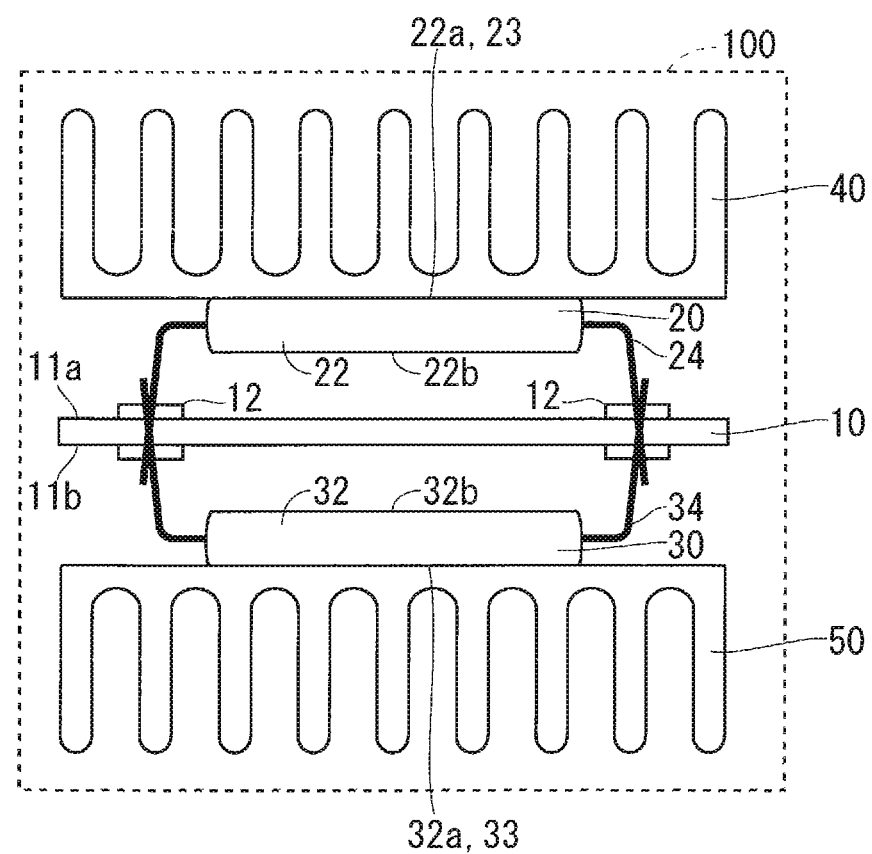
FIG. 1 is a cross-sectional view illustrating a configuration of a semiconductor device according to a first preferred embodiment.

FIG. 1 is a cross-sectional view illustrating a configuration of a semiconductor device 100 according to the first preferred embodiment. The semiconductor device 100 includes a printed wiring board 10, a first semiconductor module 20, a first heat radiator 40, a second semiconductor module 30, and a second heat radiator 50. Although described in detail below, in the first preferred embodiment, the semiconductor device 100 is a power semiconductor device including power semiconductor modules as the first semiconductor module 20 and the second semiconductor module 30.

The printed wiring board 10 is provided with a plurality of terminal parts 12 or a plurality of wires (not illustrated) for connecting the first semiconductor module 20 and the second semiconductor module 30 in parallel.

The first semiconductor module 20 includes a first package body 22, a first heat radiation surface 23, and a plurality of first external connection terminals 24.

Figure 2:
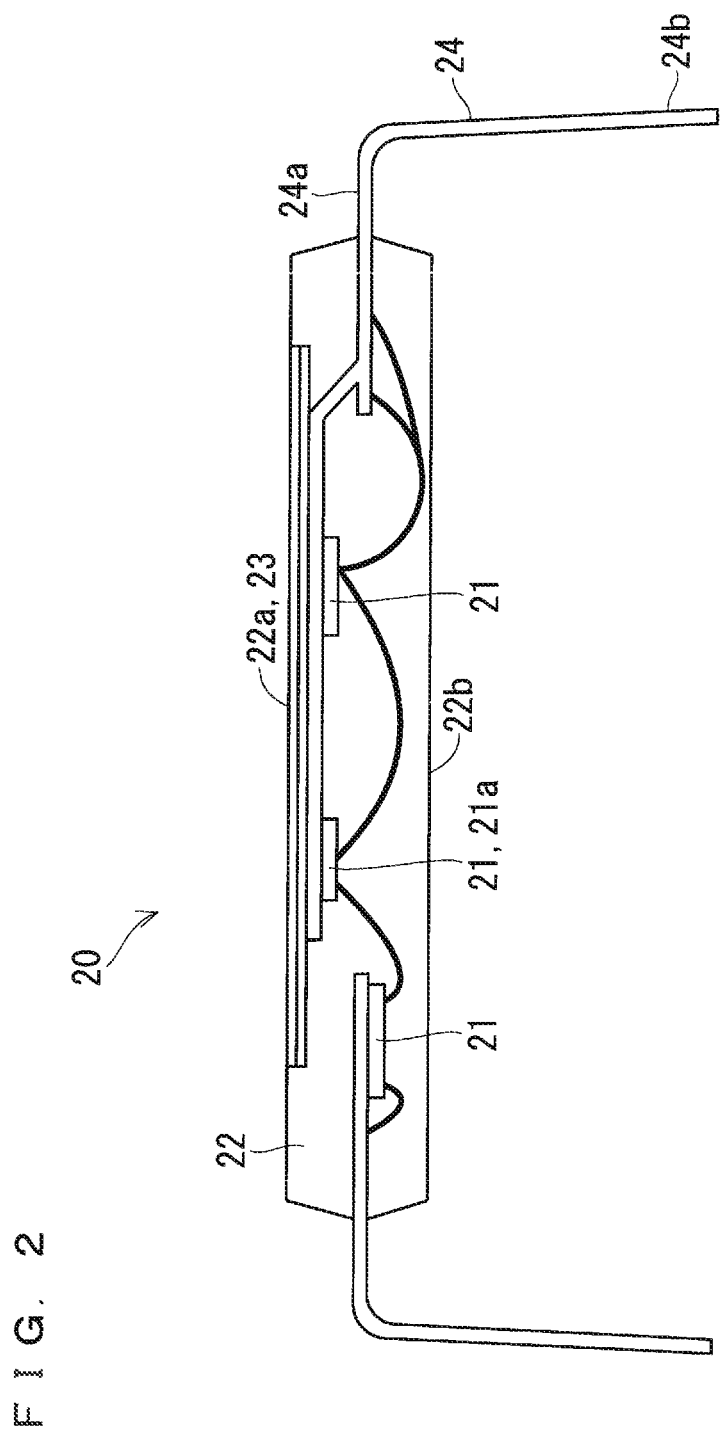
FIG. 2 is a cross-sectional view illustrating a configuration of a first semiconductor module according to the first preferred embodiment.

FIG. 2 is a cross-sectional view illustrating the configuration of the first semiconductor module 20 of the first preferred embodiment. The first package body 22 includes at least one first semiconductor element 21. In the first preferred embodiment, the first package body 22 includes a plurality of first semiconductor elements 21. The first semiconductor elements 21 include a switching element 21a, a diode, or the like. The switching element 21a is a switching element for a power semiconductor, and is, for example, a metal-oxide-semiconductor field-effect transistor (MOSFET) including a wide band gap (WBG) semiconductor such as an SiC, or an insulated gate bipolar transistor (IGBT) including a WBG semiconductor such as an SiC. That is, in the first preferred embodiment, the first semiconductor module 20 is a power semiconductor module.

The first heat radiation surface 23 is provided on one surface 22a of the first package body 22 and radiates heat generated in at least one first semiconductor element 21. The first heat radiation surface 23 is made of metal such as Cu, for example.

Figure 3:
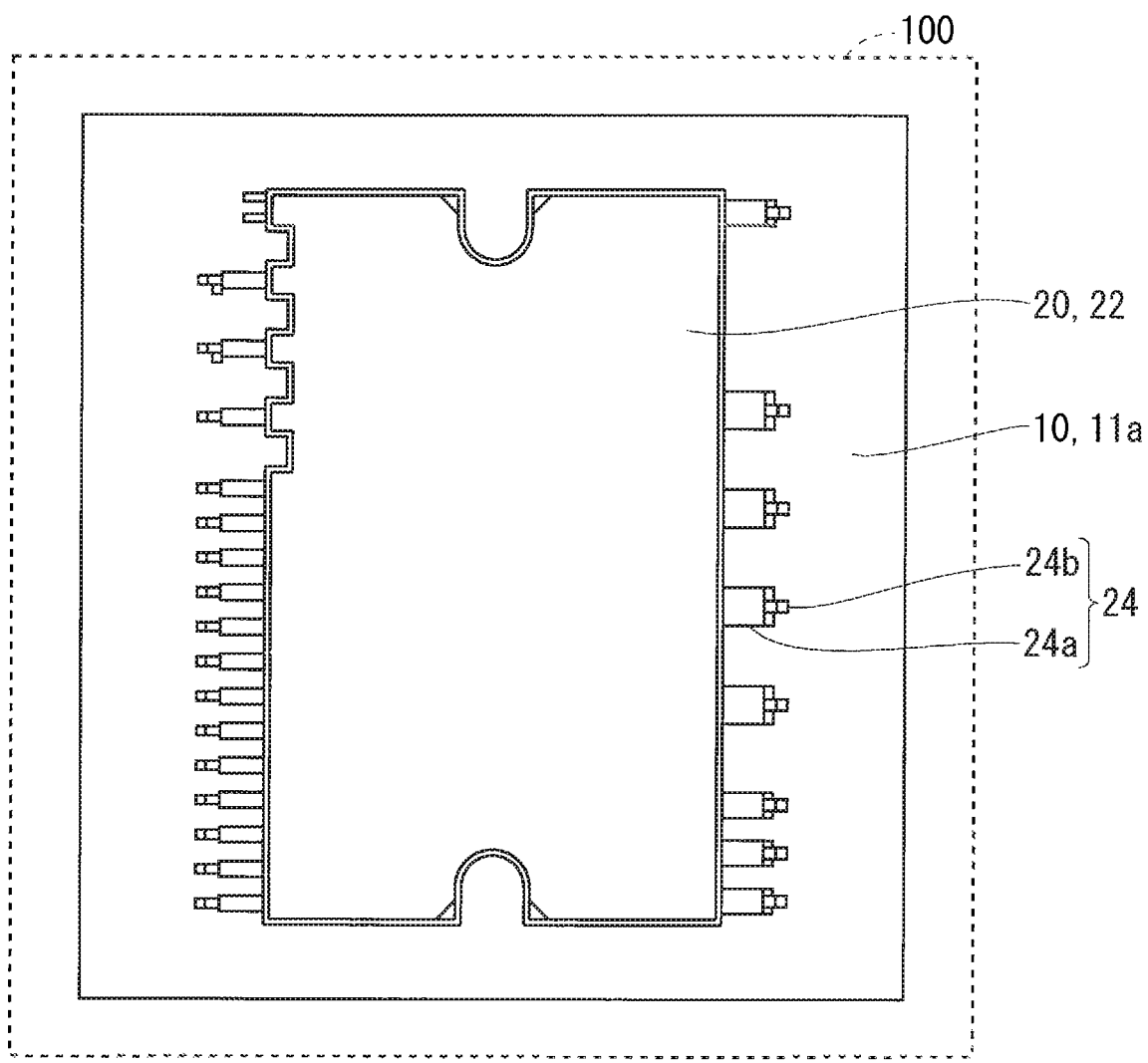
FIG. 3 is a plan view illustrating the configuration of the first semiconductor module according to the first preferred embodiment.

Each of the first external connection terminals 24 is provided to protrude from the first package body 22. In this example, each of the first external connection terminals 24 has a long bar shape or plate shape. Each of the first external connection terminals 24 includes a first base end portion 24a on a side near the first package body 22 and a first tip end portion 24b in a direction protruding from the first base end portion 24a, that is, in a tip end direction. Each of the first external connection terminals 24 is connected with at least one first semiconductor element 21 inside the first package body 22, and wires the outside and at least one first semiconductor element 21. FIG. 3 is a plan view illustrating the configuration of the first semiconductor module 20 in the first preferred embodiment, showing a state observed from one face 11a of the printed wiring board 10. In the first preferred embodiment, the first package body 22 is a dual in-line package. Each of the first external connection terminals 24 includes first base end portions 24a on two opposing sides out of the four sides constituting the outer shape of the dual in-line package. The forms of the first package body 22 and each of the first external connection terminals 24 are merely examples, and are not limited to those forms described above.

As illustrated in FIG. 1, the first heat radiator 40 is provided on the first heat radiation surface 23 of the first semiconductor module 20. The first heat radiator 40 performs heat exchange on the heat generated in the first semiconductor module 20 between the first heat radiation surface 23 and the outside. In the first preferred embodiment, the first heat radiator 40 is a heat sink, but it is not limited to this structure as long as it has a heat exchanging function.

The second semiconductor module 30 includes a second package body 32, a second heat radiation surface 33, and a plurality of second external connection terminals 34.

Figure 4:
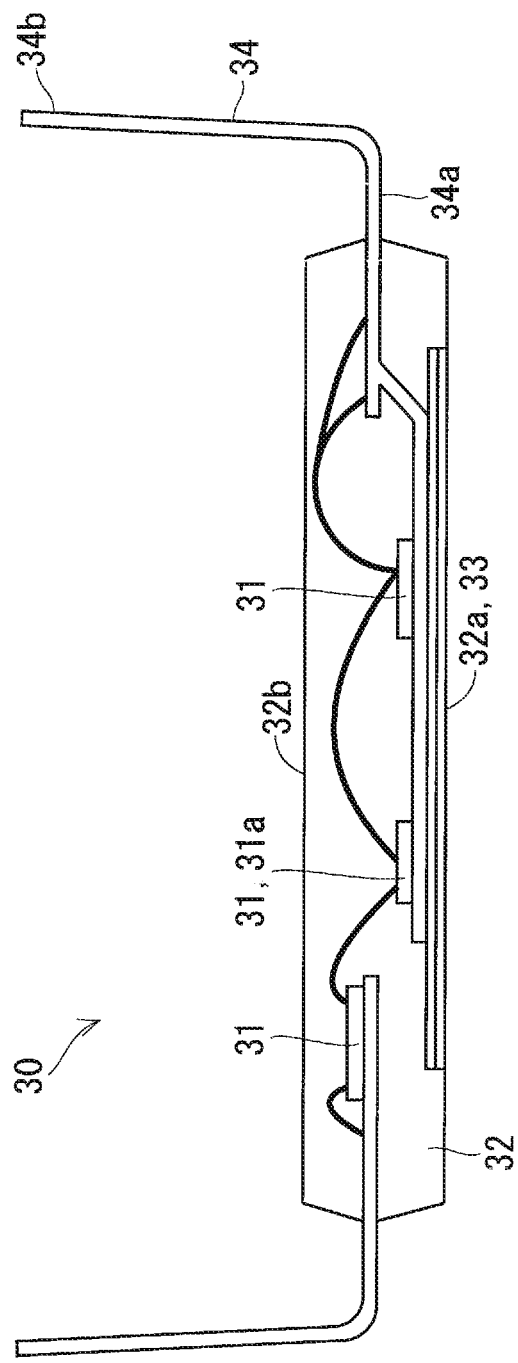
FIG. 4 is a cross-sectional view illustrating a configuration of a second semiconductor module according to the first preferred embodiment.

FIG. 4 is a cross-sectional view illustrating a configuration of the second semiconductor module 30 in the first preferred embodiment. The second package body 32 includes at least one second semiconductor element 31. In the first preferred embodiment, the second package body 32 includes a plurality of second semiconductor elements 31. The plurality of second semiconductor elements 31 include a switching element 31a, a diode, or the like. The switching element 31a is a switching element for a power semiconductor, and is, for example, a MOSFET including a WBG semiconductor such as an SiC or an IGBT including a WBG semiconductor such as an SiC. That is, in the first preferred embodiment, the second semiconductor module 30 is a power semiconductor module.

The second heat radiation surface 33 is provided on one surface 32a of the second package body 32, and radiates heat generated in at least one second semiconductor element 31. The second heat radiation surface 33 is made of metal such as Cu, for example.

Figure 5:
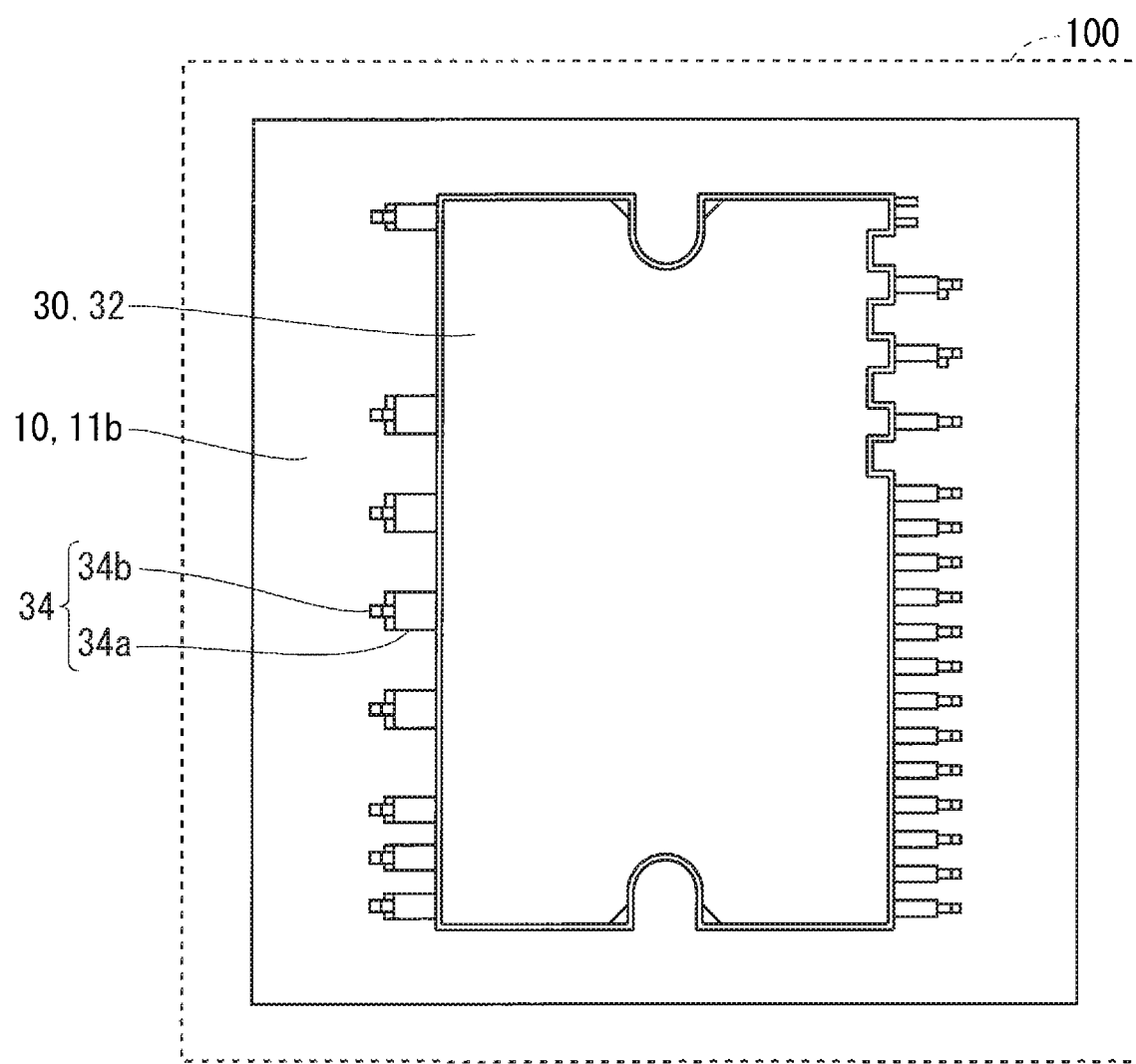
FIG. 5 is a plan view illustrating the configuration of the second semiconductor module according to the first preferred embodiment.

Each of the second external connection terminals 34 is provided to protrude from the second package body 32. Here, each of the second external connection terminals 34 has a long bar shape or plate shape. Each of the second external connection terminals 34 includes a second base end portion 34a on a side near the second package body 32 and a second tip end portion 34b in a direction protruding from the second base end portion 34a, that is, in a tip end direction. Each of the second external connection terminals 34 is connected to at least one second semiconductor element 31 inside the second package body 32 and wires the outside and at least one second semiconductor element 31. FIG. 5 is a plan view illustrating the configuration of the second semiconductor module 30 of the first preferred embodiment, showing a state observed from another face 11b of the printed wiring board 10. In the first preferred embodiment, the second package body 32 is also a dual in-line package like the first package body 22. Each of the second external connection terminals 34 includes second base end portions 34a on two opposing sides out of the four sides constituting the outer shape of the dual in-line package. The forms of the second package body 32 and each of the second external connection terminals 34 are merely examples and are not limited to those forms described above.

As illustrated in FIGS. 3 and 5, the first base end portion 24a of each of the first external connection terminals 24 and the second base end portion 34a of each of the second external connection terminals 34 are arranged in a mirror image positional relation. The first tip end portion 24b and the second tip end portion 34b are also arranged in a mirror image positional relation. The shape of the first package body 22 and the shape of the second package body 32 also have a mirror image relation. Further, as illustrated in FIGS. 2 and 4, for example, at least one first semiconductor element 21 included in the first package body 22 and at least one second semiconductor element 31 included in the second package body 32 may be arranged in a mirror image positional relation with each other. As described above, each constitutional element of the first semiconductor module 20 and each constitutional element of the second semiconductor module 30 have a mirror image relation. Furthermore, the first semiconductor module 20 and the second semiconductor module 30 are semiconductor modules having the same function.

As illustrated in FIG. 1, the second heat radiator 50 is provided on the second heat radiation surface 33 of the second semiconductor module 30. The second heat radiator 50 performs heat exchange on the heat generated in the second semiconductor module 30 between the second heat radiation surface 33 and the outside. In the first preferred embodiment, the second heat radiator 50 is a heat sink, but it is not limited to this structure as long as it has a heat exchanging function.

The first semiconductor module 20 is disposed such that another surface 22b of the first package body 22, opposite to the first heat radiation surface 23, faces the one face 11a of the printed wiring board 10. The second semiconductor module 30 is disposed such that another surface 32b of the second package body 32, opposite to the second heat radiation surface 33, faces the other face 11b of the printed wiring board 10. Further, in a plan view of the printed wiring board 10, the first semiconductor module 20 and the second semiconductor module 30 are arranged to overlap each other. Here, as illustrated in FIG. 1, the first semiconductor module 20 and the second semiconductor module 30 are arranged in a mirror-image manner with respect to the printed wiring board 10.

Each of the first external connection terminals 24 of the first semiconductor module 20 is connected to each of the terminal parts 12 provided on the one face 11a of the printed wiring board 10. Here, each of the terminal parts 12 of the printed wiring board 10 has a through hole (not illustrated). Each of the first external connection terminals 24 passes through the through hole, and is connected to each of the terminal parts 12 via solder (not illustrated), for example. Similarly, each of the second external connection terminals 34 of the second semiconductor module 30 is connected to each of the terminal parts 12 provided on the other face 11b of the printed wiring board 10. Here, each of the second external connection terminals 34 penetrates another through hole provided next to the through hole through which each of the first external connection terminals 24 penetrates, and is connected to each of the terminal parts 12 via solder, for example. Each of the first external connection terminals 24 is electrically connected to each of the second external connection terminals 34 via each of the terminal parts 12 of the printed wiring board 10. The second semiconductor module 30 is connected in parallel to the first semiconductor module 20 such that each of the second external connection terminals 34 is connected to each of the first external connection terminals 24 via each of the terminal parts 12 of the printed wiring board 10.

(Underlying Technology)

Figure 6:
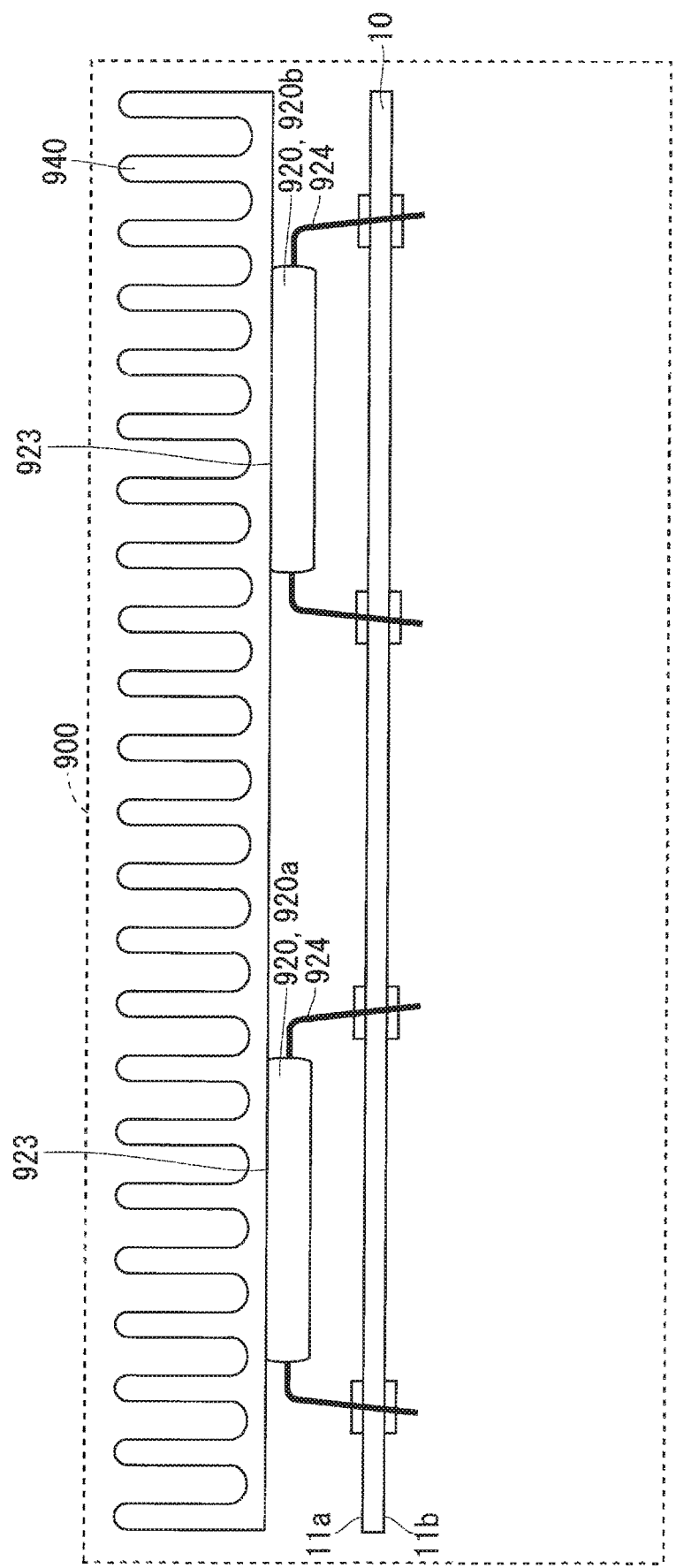
FIG. 6 is a cross-sectional view illustrating a configuration of a semiconductor device according to underlying technology.

Before explaining the operational effects of the semiconductor device 100 of the first preferred embodiment, underlying technology will be described. FIG. 6 is a cross-sectional view illustrating a configuration of a semiconductor device 900 according to the underlying technology.

In the underlying technology, two semiconductor modules 920 (hereinafter one is referred to as a semiconductor module 920a and the other as a semiconductor module 920b) are disposed side by side on one face 11a of the printed wiring board 10. The internal configuration of each of the one semiconductor module 920a and the other semiconductor module 920b and each of the external connection terminals 924 do not have a mirror image configuration but have the same configuration. In addition, the one semiconductor module 920a and the other semiconductor module 920b are not disposed in a mirror image positional relation with respect to the printed wiring board 10. The heat radiator 940 is provided to one side of the printed wiring board 10. In other words, the heat radiator 940 is provided to a heat radiation surface 923 of each of the semiconductor modules 920 disposed on a side of the one face 11a. The occupied area of the semiconductor device 900 having the above structure is larger than the dimensions of at least two semiconductor modules 920.

Figure 7:
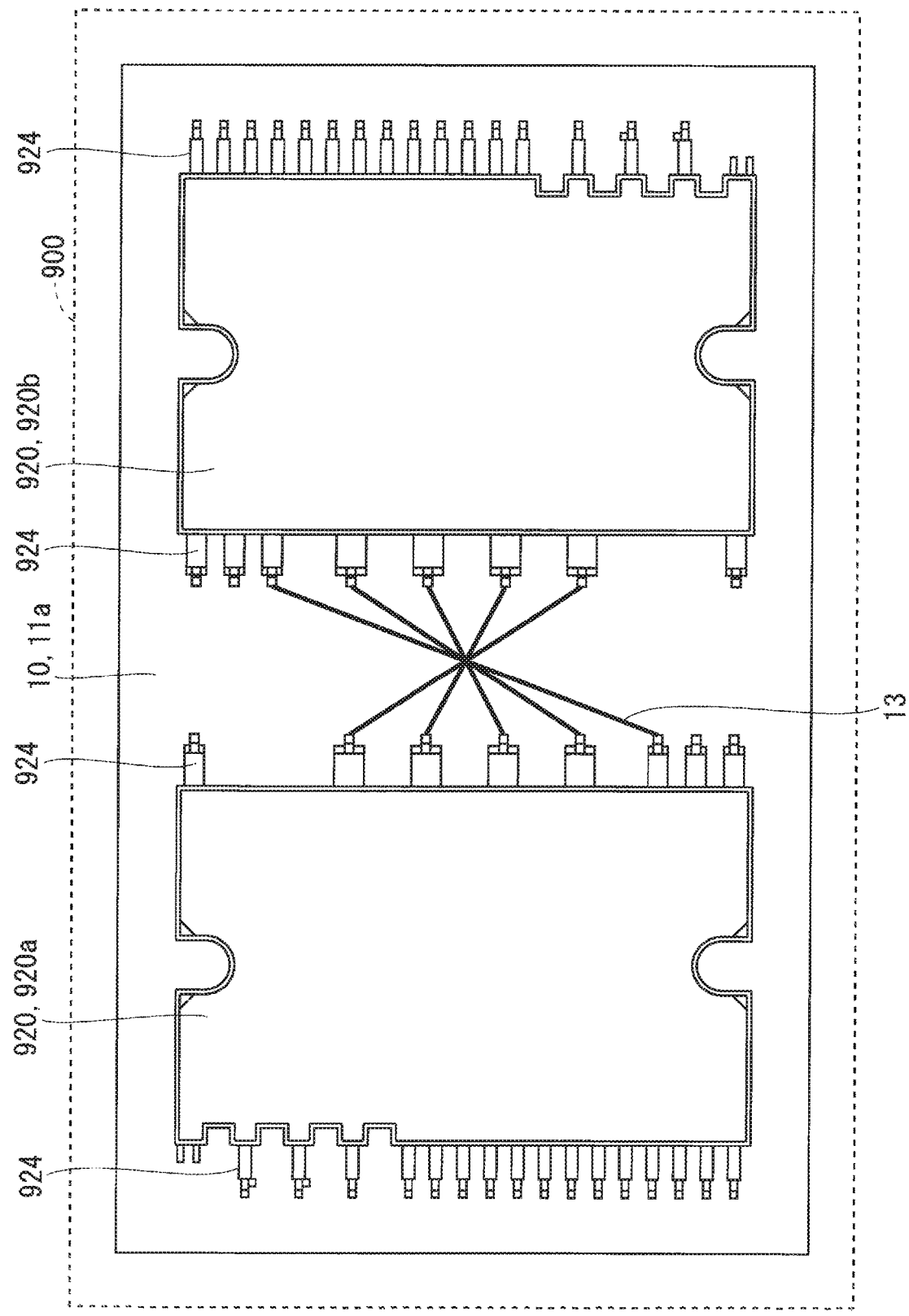
FIG. 7 is a plan view illustrating the configuration of the semiconductor device according to the underlying technology.

FIG. 7 is a plan view illustrating the configuration of the semiconductor device 900 of the underlying technology. With respect to the one semiconductor module 920a, the other semiconductor module 920b is turned by 180 degrees on the plane of the printed wiring board 10. In the case where the one semiconductor module 920a and the other semiconductor module 920b are connected in parallel, it is necessary to provide intersecting wires 13 on the printed wiring board 10 in order to connect respective external connection terminals 924. In FIG. 7, for the sake of simplicity, only a part of the wires is shown. However, many intersecting wires are required to connect the other external connecting terminals. Thereby, the pattern of the wire 13 for connecting the two semiconductor modules 920 in parallel is complicated.

Figure 8:
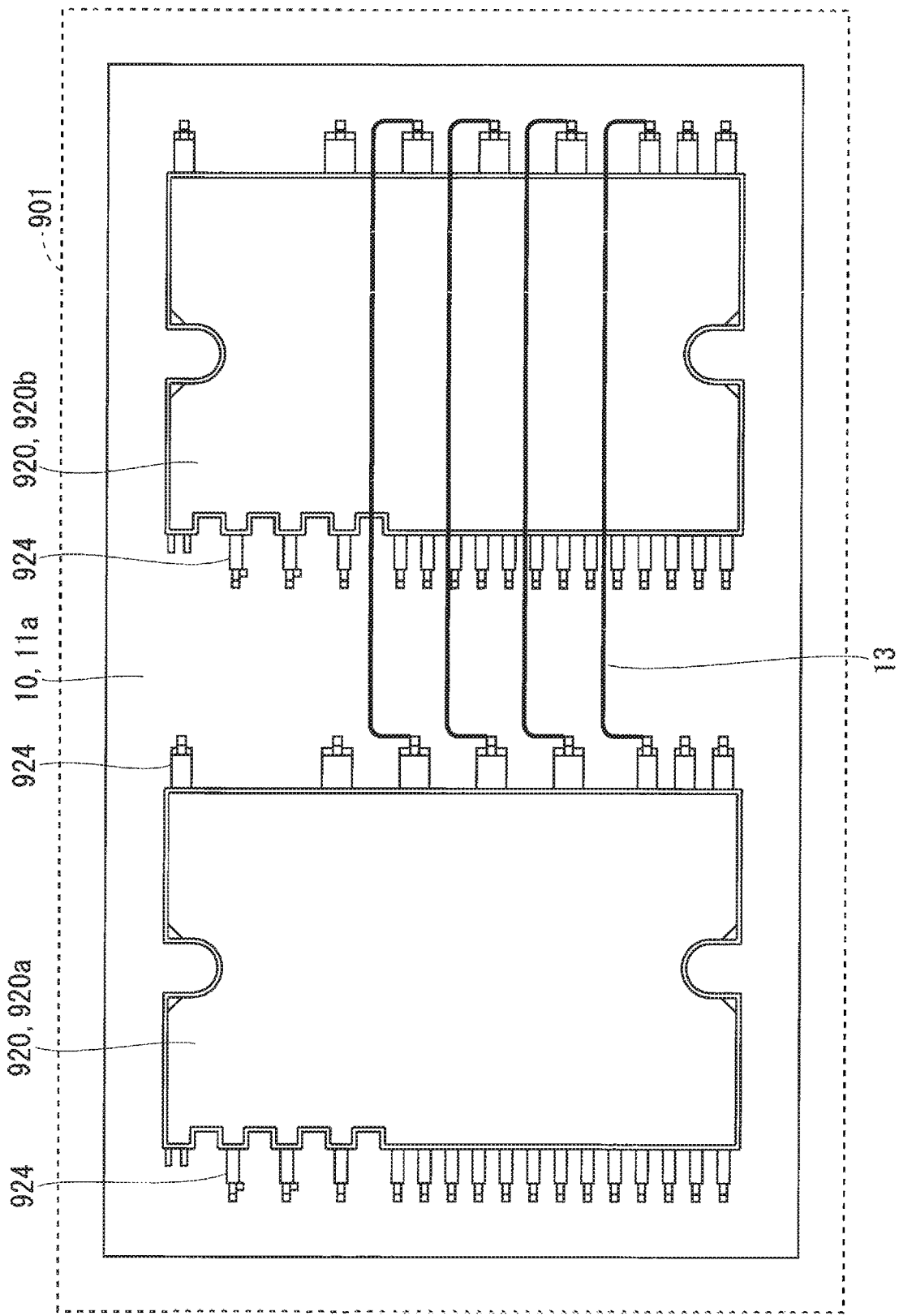
FIG. 8 is a plan view illustrating another configuration of the semiconductor device according to the underlying technology.

FIG. 8 is a plan view illustrating a configuration of a semiconductor device 901 according to the underlying technology. The other semiconductor module 920b is disposed side by side in the same direction as the one semiconductor module 920a. Respective external connection terminals 924 are connected by the wire 13 including a jumper wire. By using the jumper wire, the pattern of the wire 13 on the printed wiring board 10 is not complicated as compared with the wiring of FIG. 7, but the wiring as the whole semiconductor device 901 becomes complicated.

Figure 9:
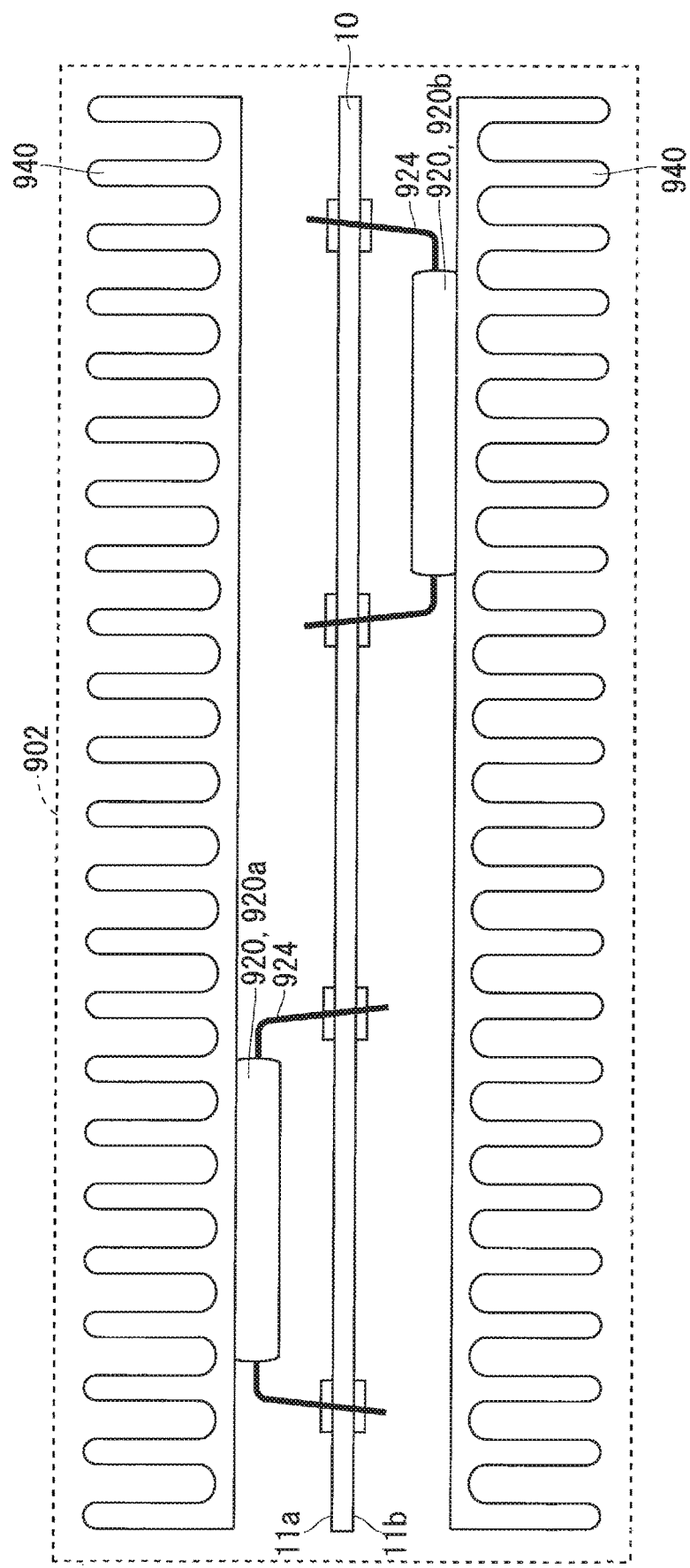
FIG. 9 is a cross-sectional view illustrating yet another configuration of the semiconductor device according to the underlying technology.
Figure 10:
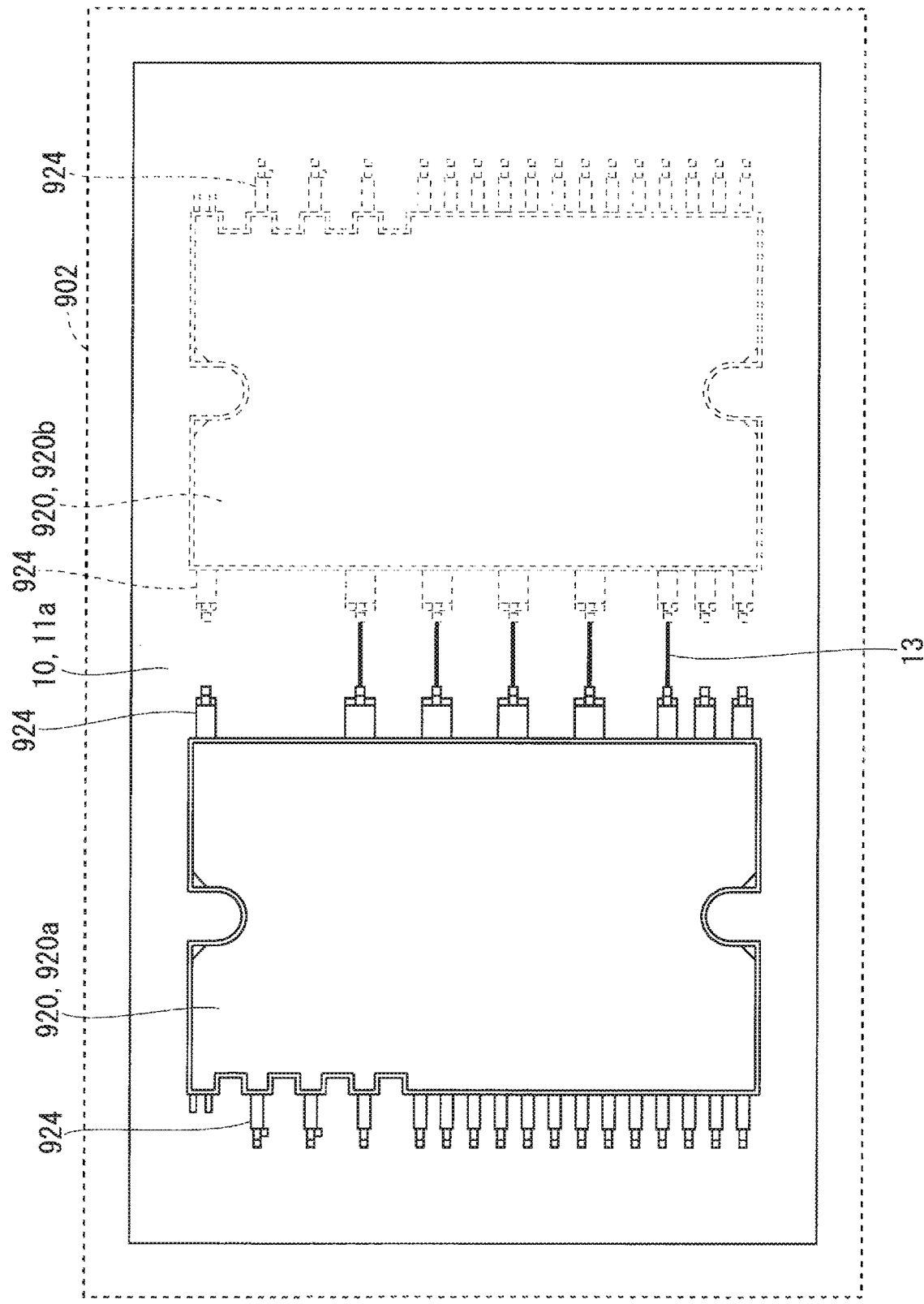
FIG. 10 is a plan view illustrating a configuration of a semiconductor device according to the underlying technology illustrated in FIG. 9.

FIG. 9 is a cross-sectional view illustrating a configuration of a semiconductor device 902 according to the underlying technology. FIG. 10 is a plan view illustrating the configuration of the semiconductor device 902 according to the underlying technology illustrated in FIG. 9. One semiconductor module 920a is arranged on one face 11a of the printed wiring board 10 and the other semiconductor module 920b is arranged on the other face 11b of the printed wiring board 10. The other semiconductor module 920b is arranged so as not to overlap the one semiconductor module 920a. When the one semiconductor module 920a and the other semiconductor module 920b are connected in parallel, part of the wires 13 connecting adjacent external connection terminals 924 is shorter than the wire 13 illustrated in FIG. 7 or 8 and is simplified. However, the occupied area of the semiconductor device 902 is larger than the dimensions of at least the two semiconductor modules 920. Also, the shortened wire 13 is limited to some external connection terminals among the plurality of external connection terminals 924. Therefore, the effect of size reduction is small.

Although not illustrated, in the case of semiconductor modules each having a configuration in which respective external connection terminals are aligned in a row on one side of the package body, it is possible to shorten the wiring by arranging the semiconductor modules such that respective external connection terminals face each other on the plane of the printed wiring board. However, the semiconductor module in which respective external connection terminals are aligned on one side of the package body causes an increase in the size of the semiconductor module itself, whereby it is difficult to miniaturize the size of the semiconductor device.

(Effect)

In the semiconductor device 100 according to the first preferred embodiment, although the first semiconductor module 20 is mounted on the one face 11a of the printed wiring board 10 and the second semiconductor module 30 is mounted on the other face 11b, the occupied area thereof is not larger than the combined area of the two semiconductor modules. In addition, since the heat radiator is provided to the heat radiation surface of each of the semiconductor modules, the heat radiation performance is improved. The semiconductor device 100 according to the first preferred embodiment is low in cost because a special casing or the like is unnecessary.

In addition, the first semiconductor module 20 and the second semiconductor module 30 are not necessarily required to have intersecting wires, and are rationally wired at the shortest distance. It is also possible to minimize the area occupied by the printed wiring board 10.

The first preferred embodiment shows an example in which the first package body 22 of the first semiconductor module 20 and the second package body 32 of the second semiconductor module 30 are dual in-line packages. The forms of the packages and the external connection terminals are not limited to the above, and, for example, the external connection terminals may be arranged in a staggered lattice form or arranged in a plurality of rows of three or more rows. Alternatively, external connection terminals may be provided on each side of three or more sides constituting the outer shape of the package. These have the same effect as that described above.

In summary, the semiconductor device 100 according to the first preferred embodiment includes the printed wiring board 10, the first semiconductor module 20, the first heat radiator 40, the second semiconductor module 30, and the second heat radiator 50. The first semiconductor module 20 includes the first package body 22 and the first heat radiation surface 23. The first package body 22 includes at least one first semiconductor element 21. The first heat radiation surface 23 is provided on the one surface 22a of the first package body 22 and configured to radiate heat generated in the first semiconductor element 21. The first semiconductor module 20 is disposed such that the other surface 22b of the first package body 22, opposite to the first heat radiation surface 23, faces the one face 11a of the printed wiring board 10. The first heat radiator 40 is provided on the first heat radiation surface 23 of the first semiconductor module. The second semiconductor module 30 includes the second package body 32 and the second heat radiation surface 33. The second package body 32 includes the second semiconductor element 31. The second heat radiation surface 33 is provided on the one surface 32a of the second package body 32 and configured to radiate heat generated in the second semiconductor element 31. The second semiconductor module 30 is disposed such that another surface 32b of the second package body 32, opposite to the second heat radiation surface 33, faces the other face 11b of the printed wiring board 10. The second heat radiator 50 is provided on the second heat radiation surface 33 of the second semiconductor module 30. The first semiconductor module 20 and the second semiconductor module 30 are arranged to overlap each other in a plan view. The second semiconductor module 30 is connected in parallel to the first semiconductor module 20.

With the above configuration, while the occupied area of the semiconductor device 100 is reduced, the heat radiation performance can be improved and the cost can be reduced. Although the first semiconductor module 20 is mounted on the one face 11a of the printed wiring board 10 and the second semiconductor module 30 is mounted on the other face 11b, the occupied area is never be larger than the combined area of the two semiconductor modules. In addition, the first semiconductor module 20 and the second semiconductor module 30 are connected in parallel with simple wiring. In other words, intersecting wires are not necessarily required, and both are rationally wired with the shortest distance. As a result, it is also possible to minimize the occupied area on the printed wiring board 10. In addition, since the heat radiator is provided to the heat radiation surface of each of the semiconductor modules, the semiconductor device 100 can radiate heat from both sides, and the heat radiation performance is improved. The semiconductor device 100 according to the first preferred embodiment is low in cost because a special casing or the like is unnecessary.

The printed wiring board 10 of the semiconductor device 100 according to the first preferred embodiment includes a plurality of terminal parts 12. The first semiconductor modules 20 includes a plurality of first external connection terminals 24 each provided to protrude from the first package body 22 and connected to at least one first semiconductor element 21. Each of the first external connection terminals 24 includes a first base end portion 24a on the side near the first package body 22 and a first tip end portion 24b in a direction protruding from the first base end portion 24a. The second semiconductor modules 30 includes a plurality of second external connection terminals 34 each provided to protrude from the second package body 32 and connected to at least one second semiconductor element 31. Each of the second external connection terminals 34 includes a second base end portion 34a on the side near the second package body 32 and a second tip end portion 34b in a direction protruding from the second base end portion 34a. The first base end portion 24a of each of the first external connection terminals 24 and the second base end portion 34a of each of the second external connection terminals 34 are arranged in a mirror image positional relation. The second semiconductor module 30 is connected in parallel to the first semiconductor module 20 such that each of the second external connection terminals 34 is connected to each of the first external connection terminals 24 via each of the terminal parts 12 of the printed wiring board 10.

With such a configuration, when the first semiconductor module 20 and the second semiconductor module 30 are connected in parallel, it is possible to rationally connect them at the shortest distance, whereby it is possible to minimize the occupied area of the printed wiring board 10.

Second Preferred Embodiment

A semiconductor device according to a second preferred embodiment will be described. Note that description of the same configuration and operation as those in the first preferred embodiment will be omitted.

Figure 11:
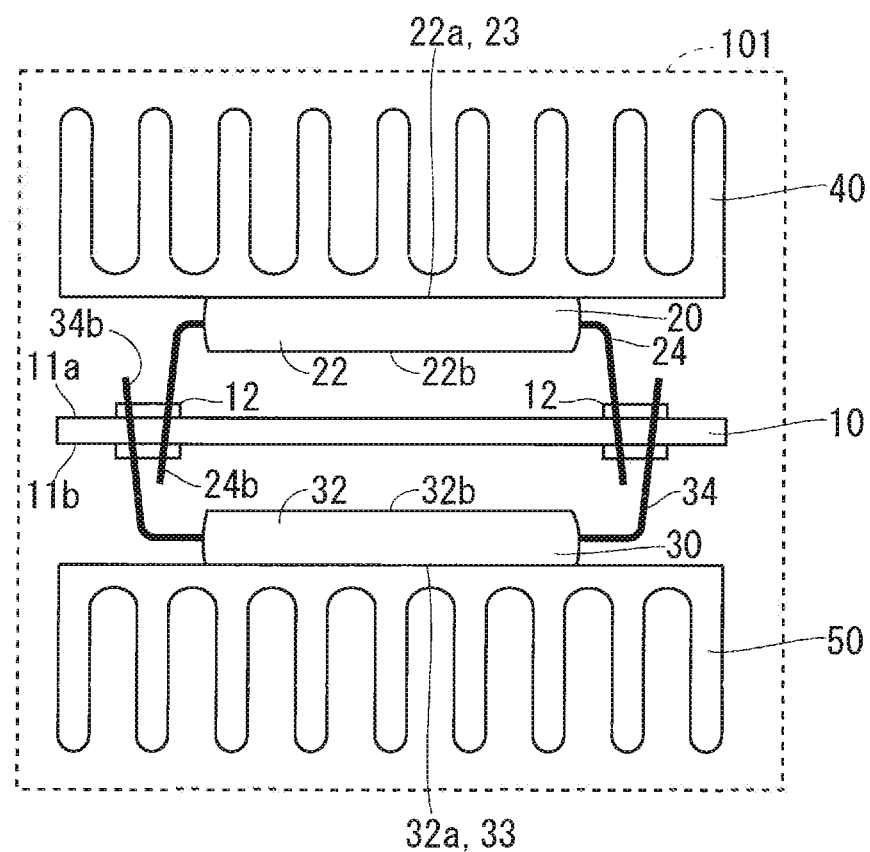
FIG. 11 is a cross-sectional view illustrating a configuration of a semiconductor device according to a second preferred embodiment.
Figure 12:
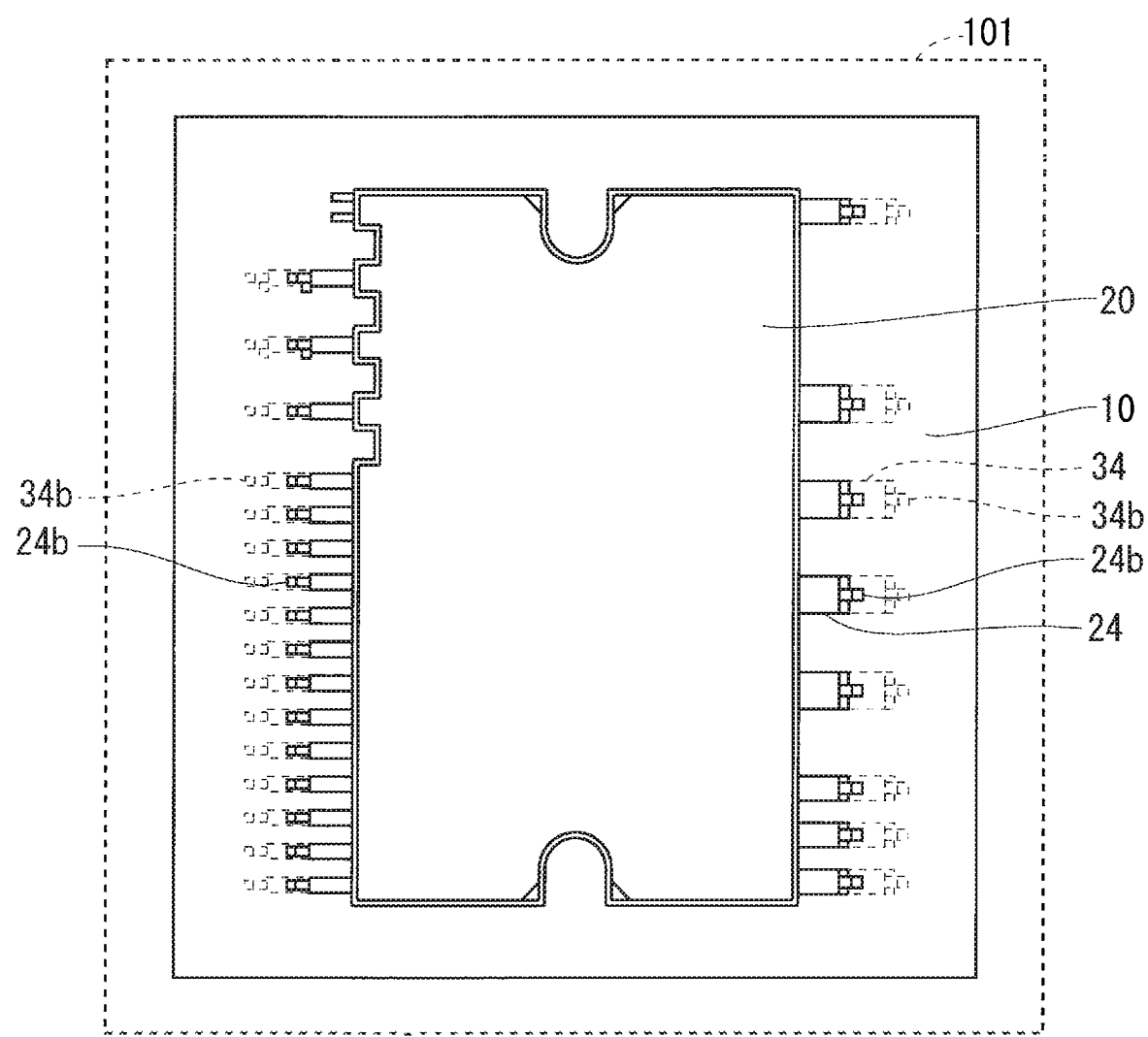
FIG. 12 is a plan view illustrating the configuration of the semiconductor device according to the second preferred embodiment.

FIG. 11 is a cross-sectional view illustrating a configuration of a semiconductor device 101 according to the second preferred embodiment. FIG. 12 is a plan view illustrating the configuration of the semiconductor device 101 according to the second preferred embodiment, showing a configuration observed from the side of the one face 11a of the printed wiring board 10 on which the first semiconductor module 20 is disposed. That is, in FIG. 12, the first semiconductor module 20, the printed wiring board 10, and the second semiconductor module (only each of the second external connection terminals 34 is illustrated) are arranged in this order from the front of the drawing.

Each of the terminal parts 12 of the printed wiring board 10 has a through hole (not illustrated). Each of the first external connection terminals 24 of the first semiconductor module 20 and each of the second external connection terminals 34 of the second semiconductor module 30 penetrate different through holes respectively, and are fixed by solder (not illustrated) to each of the terminal parts 12. The second tip end portion 34b of each of the second external connection terminals 34 of the second semiconductor module 30 is nested with respect to the first tip end portions 24b of each of the first external connection terminals 24 of the first semiconductor module 20. Here, the second tip end portion 34b of each of the second external connection terminals 34 is disposed inside the semiconductor device 101 than the first tip end portion 24b of each of the first external connection terminals 24. That is, as illustrated in FIG. 12, a distance from the second tip end portion 34b of each of the second external connection terminals 34 provided on one side constituting the outer shape of the second package body 32, to the second tip end portion 34b of each of the second external connection terminals 34 provided on the other side opposite to the one side, is larger than the distance from the first tip end portion 24b of each of the first external connection terminals 24 provided on one side constituting the outer shape of the first package body 22 to the first tip end portion 24b of each of the first external connection terminals 24 provided on the other side opposite to the one side. However, the first base end portion 24a of each of the first external connection terminals 24 and the second base end portion 34a of each of the second external connection terminals 34 are disposed in a mirror image arrangement.

The semiconductor device 101 including such a configuration has the following effects, in addition to the effects of the first preferred embodiment. The effect thereof will be described along with a method of manufacturing the semiconductor device 101. First, the first semiconductor module 20 is placed on the one face 11a of the printed wiring board 10. At this time, each of the first external connection terminals 24 of the first semiconductor module 20 is inserted into a through hole of each of the terminal parts 12 of the printed wiring board 10. Next, each of the terminal parts 12 and each of the first external connection terminals 24 are soldered. Then, the second semiconductor module 30 is placed on the other face 11b of the printed wiring board 10. At this time, each of the second external connection terminals 34 of the second semiconductor module 30 is inserted into a through hole of each of the terminal parts 12 of the printed wiring board 10. Next, each of the terminal parts 12 and each of the second external connection terminals 34 are soldered. According to the configuration of the semiconductor device 101 of the second preferred embodiment described above, in the step of soldering each of the second external connection terminals 34, an interface between each of the first external connection terminals 24 of the first semiconductor module 20 and the soldering iron can be avoided, and an operation of mounting the second semiconductor module 30, in particular, the soldering, can be performed easily. For example, in the soldering step, there is no need to place and solder the second semiconductor module 30 off the position of the first semiconductor module 20. That is, it is easy to dispose the first package body 22 and the second package body 32 in a mirror image arrangement with respect to the printed wiring board 10. It is also possible to realize a configuration in which the first heat radiator 40 and the second heat radiator 50 are collectively fixed by screws or the like.

In addition, since each of the first external connection terminals 24 and each of the second external connection terminals 34 are arranged close to each other on the printed wiring board 10, the wiring pattern on the printed wiring board 10 for parallel connection can be arranged efficiently without waste. Therefore, the mounting area of the first semiconductor module 20 and the second semiconductor module 30 on the printed wiring board 10 can be reduced.

Third Preferred Embodiment

A semiconductor device according to a third preferred embodiment will be described. Explanation of configurations and operations similar to those in the first and second preferred embodiments will be omitted.

Figure 13:
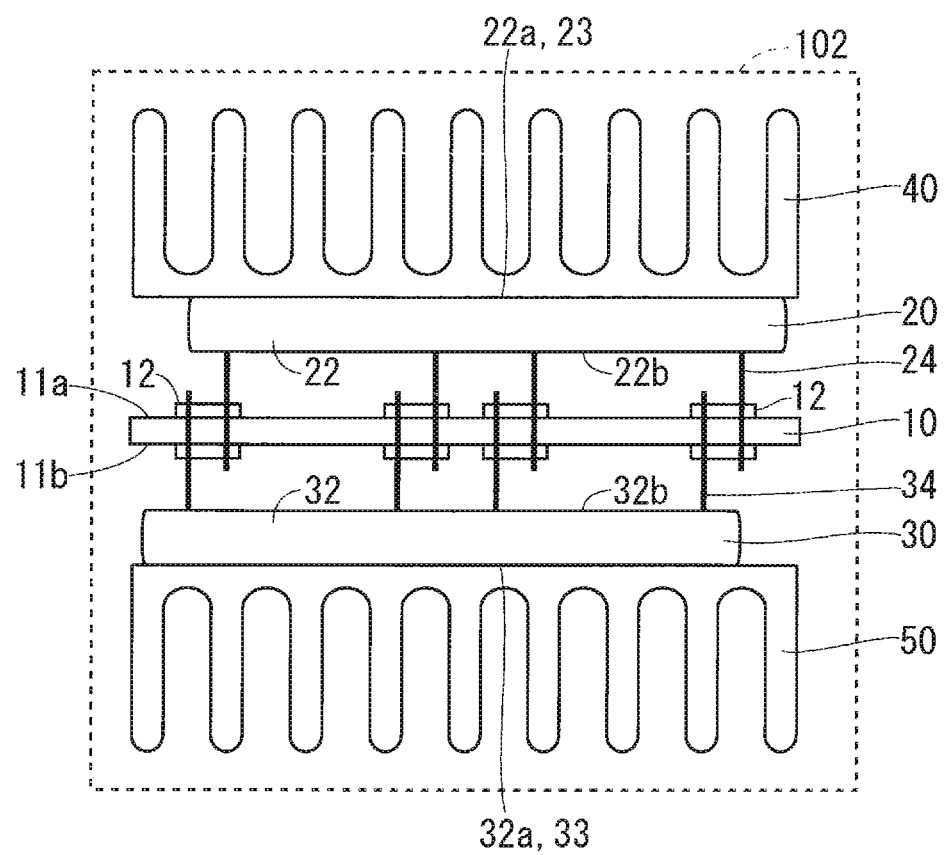
FIG. 13 is a cross-sectional view illustrating a configuration of a semiconductor device according to a third preferred embodiment.

FIG. 13 is a cross-sectional view illustrating a configuration of a semiconductor device 102 according to the third preferred embodiment. At least one of each of the first external connection terminals 24 of the first semiconductor module 20 and each of the second external connection terminals 34 of the second semiconductor module 30 includes a press-fit terminal. In the third preferred embodiment, both of each of the first external connection terminals 24 and each of the second external connection terminals 34 are press-fit terminals. Soldering process is not necessarily required for wiring by press-fit terminals. Therefore, a design of wiring patterns in consideration of the work space and the like for the soldering iron in advance, for example, a design to widen the arrangement pitch of the first external connection terminals 24 or the second external connection terminals 34, or to shift the terminal arrangement of the first external connection terminals 24 and the second external connection terminals 34, and the like, is not necessarily required.

Figure 14:
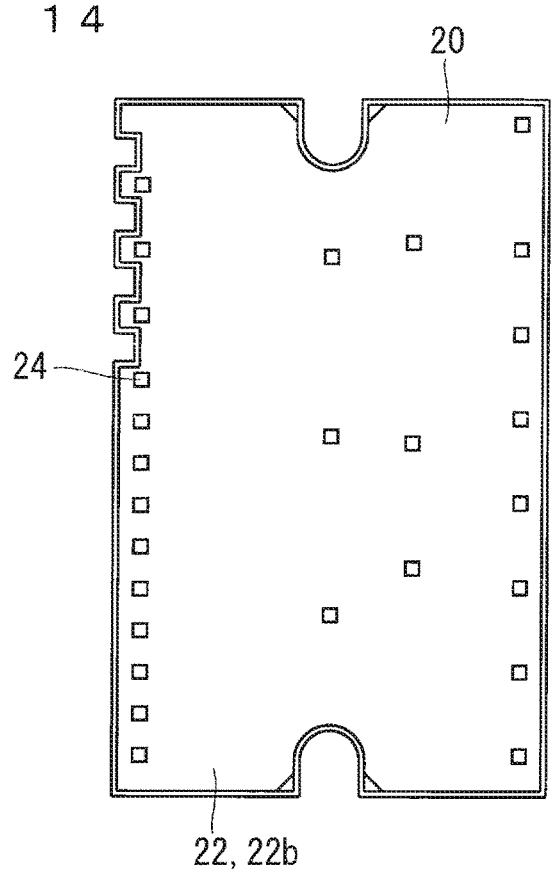
FIG. 14 is a plan view illustrating a configuration of a first semiconductor module according to the third preferred embodiment.
Figure 15:
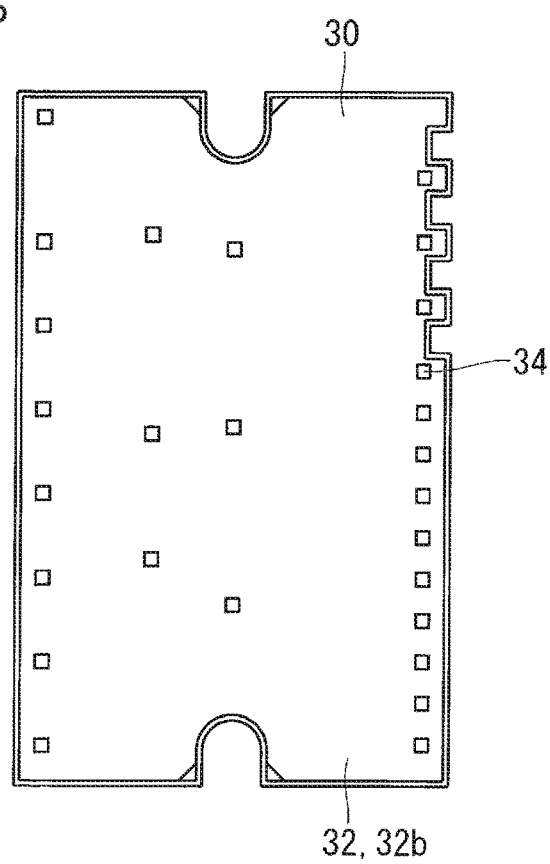
FIG. 15 is a plan view illustrating a configuration of a second semiconductor module according to the third preferred embodiment.

FIG. 14 is a plan view illustrating a configuration of the first semiconductor module 20 according to the third preferred embodiment, showing a configuration on one surface 22b facing the one face 11a of the printed wiring board 10 illustrated in FIG. 13. FIG. 15 is a plan view illustrating a configuration of the second semiconductor module 30 according to the third preferred embodiment, showing a configuration on the other surface 32b facing the other face 11b of the printed wiring board 10 illustrated in FIG. 13. The configurations of the first semiconductor module 20 and the second semiconductor module 30 have a complete mirror image relation, including the arrangement of each of the first external connection terminals 24 and each of the second external connection terminals 34.

With such a configuration, the configuration of the third preferred embodiment is effective in that the design assets in the manufacturing process of the first semiconductor module 20 and the second semiconductor module 30, such as a mold for molding the first package body 22 and the second package body 32, and the diversity of the manufacturing apparatus are increased.

Fourth Preferred Embodiment

A semiconductor device according to a fourth preferred embodiment will be described. It should be noted that description of configurations and operations similar to those of the other preferred embodiments will be omitted.

Figure 16:
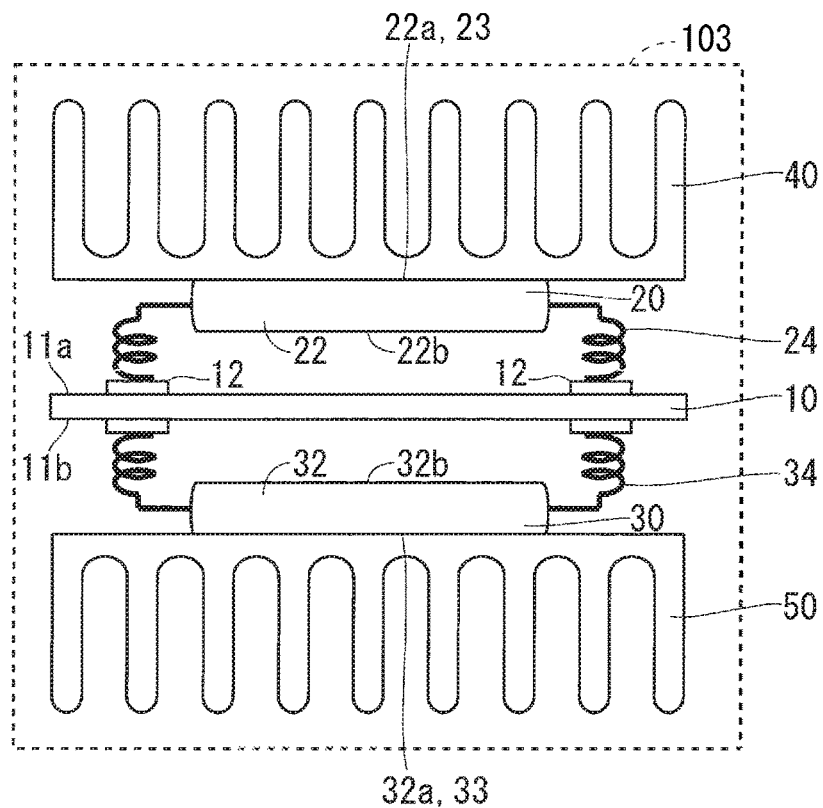
FIG. 16 is a cross-sectional view illustrating a configuration of a semiconductor device according to a fourth preferred embodiment.

FIG. 16 is a cross-sectional view illustrating a configuration of a semiconductor device 103 according to the fourth preferred embodiment. At least one of each of the first external connection terminals 24 of the first semiconductor module 20 and each of the second external connection terminals 34 of the second semiconductor module 30 includes a spring terminal. In the fourth preferred embodiment, both of each of the first external connection terminals 24 and each of the second external connection terminals 34 are spring terminals. Each of the first external connection terminals 24 and each of the second external connection terminals 34 are arranged to have a mirror image positional relation.

Similar to the press-fit terminal shown in third preferred embodiment, wiring by spring terminals does not necessarily require a soldering step. Therefore, it is unnecessary to design a wiring pattern in which work spaces and the like for the soldering iron are taken into consideration in advance. Each of the first external connection terminals 24 and each of the second external connection terminals 34 can be freely arranged according to the parallel wiring pattern of the first semiconductor module 20, the second semiconductor module 30, and the printed wiring board 10.

Fifth Preferred Embodiment

A semiconductor device according to a fifth preferred embodiment will be described. It should be noted that description of configurations and operations similar to those of the other preferred embodiments will be omitted.

Figure 17:
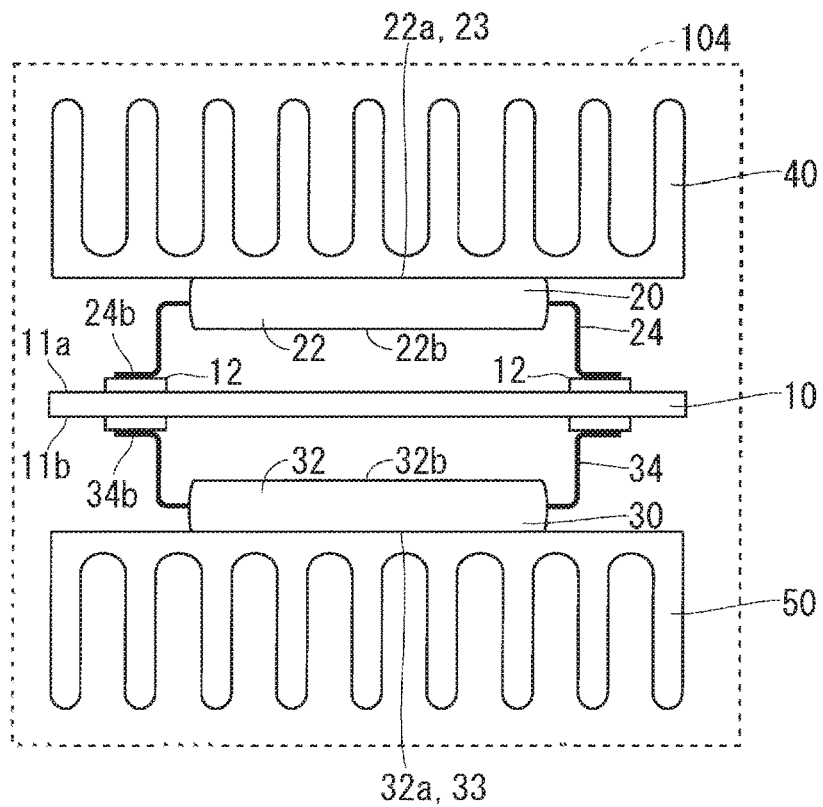
FIG. 17 is a cross-sectional view illustrating a configuration of a semiconductor device according to a fifth preferred embodiment.

FIG. 17 is a cross-sectional view illustrating a configuration of a semiconductor device 104 in the fifth preferred embodiment. At least one of each of the first external connection terminals 24 of the first semiconductor module 20 and each of the second external connection terminals 34 of the second semiconductor module 30 includes a plate-shaped terminal that is bent parallel to the printed wiring board 10 and is in surface contact with each of the terminal parts 12. In the fourth preferred embodiment, both the first tip end portion 24b of each of the first external connection terminals 24 and the second tip end portion 34b of each of the second external connection terminals 34 are plate-shaped terminals that are bent outward and are in surface contact with each of the terminal parts 12 of the printed wiring board 10. Each of the first external connection terminals 24 and each of the second external connection terminals 34 are arranged to have a mirror image positional relation.

For example, when the plate-shaped terminal of each of the second external connection terminals 34 is soldered to each of the terminal parts 12 of the other face 11b of the printed wiring board 10, each of the first external connection terminals 24 connected to the one face 11a does not protrude to a side of the other face 11b, and the soldering process is easily performed. Therefore, it is unnecessary to design a wiring pattern in which work spaces and the like for the soldering iron are taken into consideration in advance. In addition, each of the first external connection terminals 24 and each of the second external connection terminals 34 can be freely arranged according to the parallel wiring pattern of the first semiconductor module 20, the second semiconductor module 30, and the printed wiring board 10.

Sixth Preferred Embodiment

A semiconductor device according to a sixth preferred embodiment will be described. It should be noted that description of configurations and operations similar to those of the other preferred embodiments will be omitted.

Figure 18:
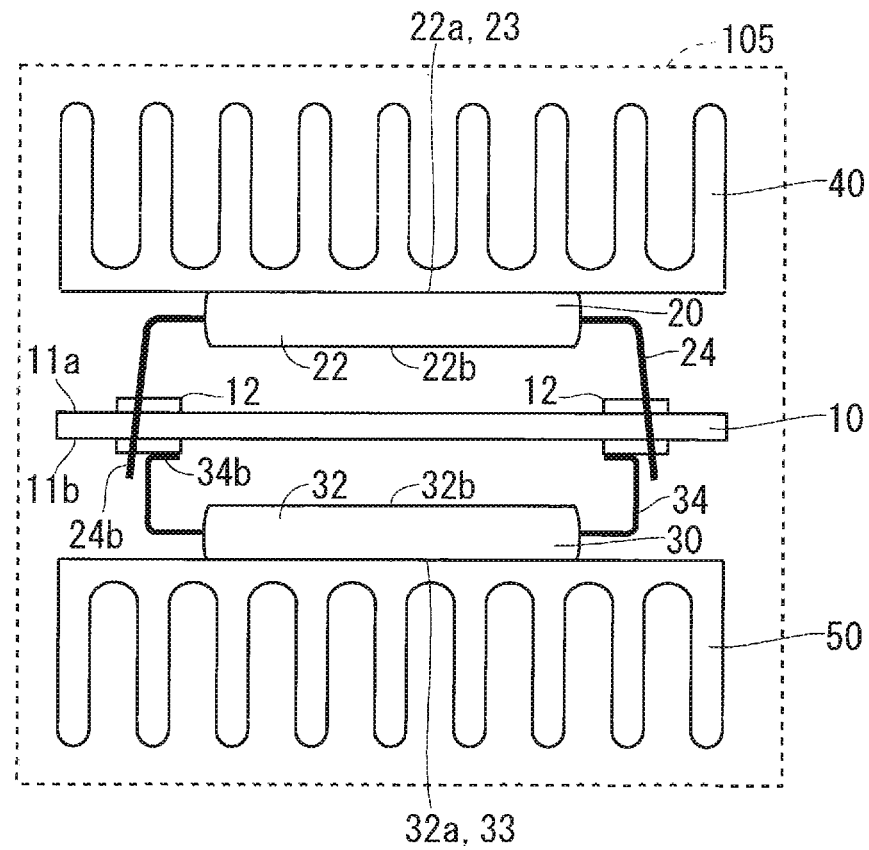
FIG. 18 is a cross-sectional view illustrating a configuration of a semiconductor device according to a sixth preferred embodiment.

FIG. 18 is a cross-sectional view illustrating a configuration of a semiconductor device 105 according to the sixth preferred embodiment. Each of the first external connection terminals 24 of the first semiconductor module 20 has an elongated bar shape or plate shape, and penetrates a through hole of each of the terminal parts 12 of the printed wiring board 10 and is fixed by solder. Each of the second external connection terminals 34 of the second semiconductor module 30 is a plate-shaped terminal that is bent inward of the second semiconductor module 30 and is in surface contact with each of the terminal parts 12 of the printed wiring board 10. The second tip end portion 34b of each of the second external connection terminals 34 is nested with respect to the first tip end portion 24b of each of the first external connection terminals 24. Here, the second tip end portion 34b of each of the second external connection terminals 34 is arranged inside the semiconductor device 105 from the first tip end portion 24b of each of the first external connection terminals 24. However, the first base end portion 24a of each of the first external connection terminals 24 and the second base end portion 34a of each of the second external connection terminals 34 are disposed in a mirror image arrangement.

The semiconductor device 105 including such a configuration has advantages in its manufacturing method. Even when the second semiconductor module 30 is connected so as to have a mirror image arrangement with respect to the first semiconductor module 20 connected to the one face 11a of the printed wiring board 10, it is possible to perform the soldering step while the soldering iron and each of the first external connection terminals 24 are not interfered with each other. In other words, the second semiconductor module 30 is disposed opposite to the first semiconductor module 20 in a mirror image arrangement, without having an offset with respect to the first semiconductor module 20. Wiring patterns including power wiring and control wiring do not intersect but connect the respective terminals. The size of the printed board 10 is reduced, and the heat generated in each of the semiconductor modules is efficiently radiated from both sides of the semiconductor device 105.

Seventh Preferred Embodiment

A semiconductor device according to a seventh preferred embodiment will be described. It should be noted that description of configurations and operations similar to those of the other preferred embodiments will be omitted.

Figure 19:
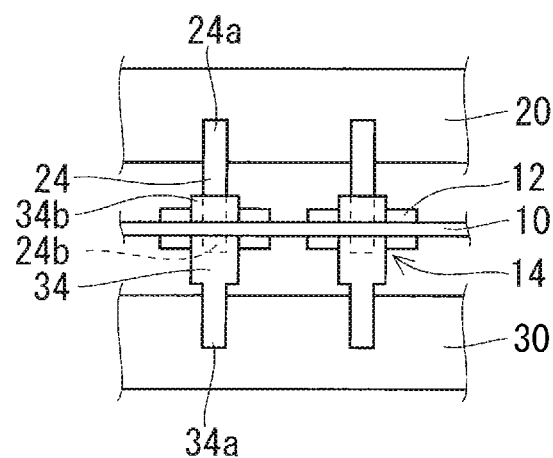
FIG. 19 is an enlarged side view illustrating a configuration in the vicinity of a terminal part of a semiconductor device according to a seventh preferred embodiment.

FIG. 19 is an enlarged side view illustrating a configuration in the vicinity of the terminal part 12 of a semiconductor device according to the seventh preferred embodiment. The printed wiring board 10 includes a through hole 14 in each of the terminal parts 12. At least one of each of the first external connection terminals 24 and each of the second external connection terminals 34 penetrates the through hole 14. In the seventh preferred embodiment, both of each of the first external connection terminals 24 and each of the second external connection terminals 34 penetrate the same through hole 14. Each of the second external connection terminals 34 has a recessed shape in the second tip end portion 34b, and each of the first external connection terminals 24 has, in the first tip end portion 24b, a protruding shape that fits into the recessed shape of the second tip end portion 34b. In the seventh preferred embodiment, the recessed shape is a hole. The protruding shape of the first tip end portion 24b of each of the first external connection terminals 24 is inserted and fitted into the recessed shape of the second tip end portion 34b of each of the second external connection terminals 34. Thereby, the second semiconductor module 30 is connected in parallel to the first semiconductor module 20. The recessed shape of the second tip end portion 34b and the protruding shape of the first tip end portion 24b may be press-fit terminals. As described above, although the first tip end portion 24b of each of the first external connection terminals 24 and the second tip end portion 34b of each of the second external connection terminals 34 have different shapes, the first base end portion 24a of each of the first external connection terminals 24 and the second base end portion 34a of each of the second external connection terminals 34 are disposed in a mirror image arrangement.

With such a configuration, the second semiconductor module 30 is disposed opposite to the first semiconductor module 20 in a mirror image arrangement, without having an offset with respect to the first semiconductor module 20. Each of the first external connection terminals 24 and each of the second external connection terminals 34 may be fixed by soldering in the through hole 14 of the printed wiring board 10. Wiring patterns including power wiring and control wiring do not intersect but connect the respective terminals. The size of the printed wiring board 10 is reduced, and the heat generated in each of the semiconductor modules is efficiently radiated from both sides of the semiconductor device.

Eighth Preferred Embodiment

A semiconductor device according to an eighth preferred embodiment will be described. It should be noted that description of the same configuration and operation as those of the seventh preferred embodiment will be omitted.

Figure 20:
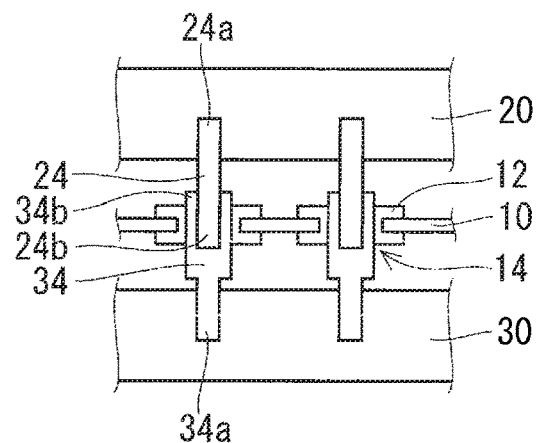
FIG. 20 is an enlarged cross-sectional view illustrating a configuration in the vicinity of a terminal part of a semiconductor device according to an eighth preferred embodiment.

FIG. 20 is an enlarged side view illustrating a configuration in the vicinity of the terminal part 12 of a semiconductor device according to the eighth preferred embodiment. In the semiconductor device according to the eighth preferred embodiment, the recessed shape of the second tip end portion 34b of each of the second external connection terminals 34 has a bifurcated slit, that is, a U shape. The protruding shape of the first tip end portion 24b of each of the first external connection terminals 24 is inserted into and engaged with the bifurcated slit of the second tip end portion 34b of each of the second external connection terminals 34. As in the seventh preferred embodiment, the first tip end portion 24b of each of the first external connection terminals 24 and the second tip end portion 34b of each of the second external connection terminals 34 have different shapes, but the first base end portion 24a of each of the first external connection terminals 24 and the second base end portion 34a of each of the second external connection terminals 34 are disposed in a mirror image arrangement.

With such a configuration, the second semiconductor module 30 can be disposed opposite to the first semiconductor module 20 to be in a mirror image arrangement, without having an offset with respect to the first semiconductor module 20. Each of the first external connection terminals 24 and each of the second external connection terminals 34 may be fixed by soldering in the through hole 14 of the printed wiring board 10. Wiring patterns including power wiring and control wiring do not intersect but connect the respective terminals. The size of the printed wiring board 10 is reduced, and the heat generated in each of the semiconductor modules is efficiently radiated from both sides of the semiconductor device.

Ninth Preferred Embodiment

A semiconductor device according to a ninth preferred embodiment will be described. It should be noted that description of configurations and operations similar to those of the other preferred embodiments will be omitted.

Figure 21:
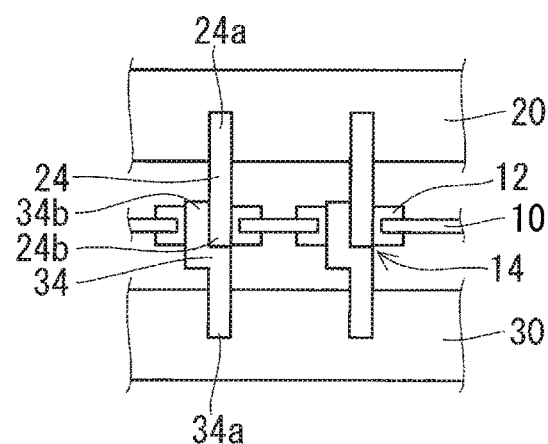
FIG. 21 is an enlarged cross-sectional view illustrating a configuration in the vicinity of a terminal part of a semiconductor device according to a ninth preferred embodiment.
Figure 22:
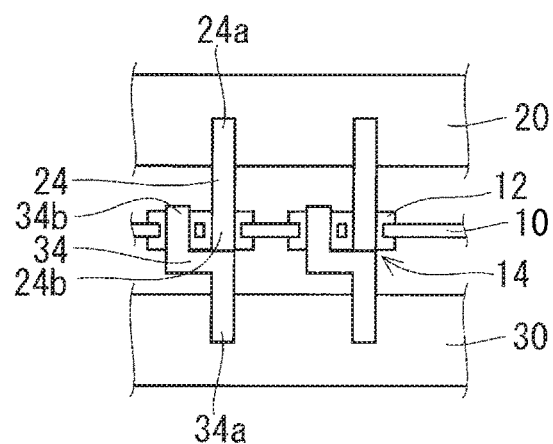
FIG. 22 is an enlarged sectional view illustrating another configuration in the vicinity of the terminal part of the semiconductor device according to the ninth preferred embodiment.

FIG. 21 is an enlarged cross-sectional view illustrating a configuration in the vicinity of the terminal part 12 of a semiconductor device according to the ninth preferred embodiment. As in the seventh preferred embodiment, both the first external connection terminal 24 and the second external connection terminal 34 penetrate the same through hole 14. Each of the second external connection terminals 34 includes an L shape in the second tip end portion 34b. That is, the second tip end portion 34b is bent in a crank shape. The first tip end portion 24b of each of the first external connection terminals 24 is in contact with the bottom surface or the side surface of the L-shaped configuration of the second tip end portion 34b. FIG. 22 is a cross-sectional view illustrating another configuration of the semiconductor device according to the ninth preferred embodiment. Each of the first external connection terminals 24 and each of the second external connection terminals 34 may be connected through an independent through hole 14. As described above, although the first tip end portion 24b of each of the first external connection terminals 24 and the second tip end portion 34b of each of the second external connection terminals 34 have different shapes, the first base end portion 24a of each of the first external connection terminals 24 and the second base end portion 34a of each of the second external connection terminals 34 are disposed in a mirror image arrangement.

With such a configuration, the second semiconductor module 30 is disposed opposite to the first semiconductor module 20 in a mirror image arrangement, without having an offset with respect to the first semiconductor module 20. Each of the first external connection terminals 24 and each of the second external connection terminals 34 may be fixed by soldering in the through hole 14 of the printed wiring board 10. Wiring patterns including power wiring and control wiring do not intersect but connect the respective terminals. The size of the printed wiring board 10 is reduced, and the heat generated in each of the semiconductor modules is efficiently radiated from both sides of the semiconductor device.

Tenth Preferred Embodiment

A semiconductor device according to a tenth preferred embodiment will be described. It should be noted that description of configurations and operations similar to those of the other preferred embodiments will be omitted.

Figure 23:
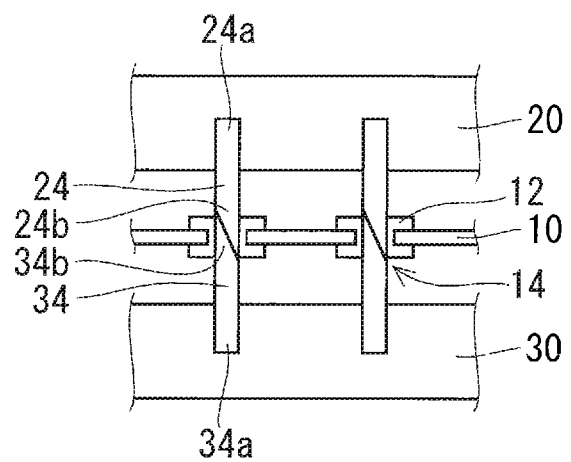
FIG. 23 is an enlarged cross-sectional view illustrating a configuration in the vicinity of a terminal part of a semiconductor device according to a tenth preferred embodiment.

FIG. 23 is an enlarged cross-sectional view illustrating a configuration in the vicinity of the terminal part 12 of a semiconductor device according to the tenth preferred embodiment. As in the seventh preferred embodiment, both the first external connection terminal 24 and the second external connection terminal 34 penetrate the same through hole 14. Each of the second external connection terminals 34 includes a tapered shape in the second tip end portion 34b. Here, the tapered shape of the second tip end portion 34b has an inclined surface. Each of the first external connection terminals 24 has, in the first tip end portion 24b, a tapered shape that is in contact with the tapered shape of the second tip end portion 34b. Here, the tapered shape of the first tip end portion 24b has an inclined surface that can be brought into contact with the inclined surface of the tapered shape of the second tip end portion 34b. As illustrated in FIG. 23, in the cross-sectional view, a shape including each of the first external connection terminals 24 and each of the second external connection terminals 34 has 2-fold rotational symmetry, and each of the first external connection terminals 24 and each of the second external connection terminals 34 are arranged in a mirror image positional relation.

When each of the second external connection terminals 34 of the second semiconductor module 30 is connected to each of the first external connection terminals 24 of the first semiconductor module 20 in the manufacturing process of the semiconductor device, the inclined surface of the second tip end portion 34b is connected along the inclined surface of the first tip end portion 24b. Therefore, the second semiconductor module 30 is arranged without interfering with the position of the first semiconductor module 20.

With such a configuration, the second semiconductor module 30 is disposed opposite to the first semiconductor module 20 in a mirror image arrangement, without having an offset with respect to the first semiconductor module 20. Each of the first external connection terminals 24 and each of the second external connection terminals 34 may be fixed by soldering in the through hole 14 of the printed wiring board 10. Wiring patterns including power wiring and control wiring do not intersect but connect the respective terminals. The size of the printed wiring board 10 is reduced, and the heat generated in each of the semiconductor modules is efficiently radiated from both sides of the semiconductor device.

Eleventh Preferred Embodiment

A semiconductor device according to an eleventh preferred embodiment will be described. It should be noted that description of configurations and operations similar to those of the other preferred embodiments will be omitted.

Figure 24:
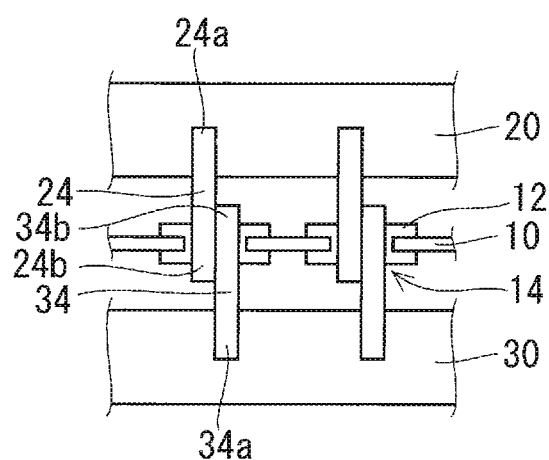
FIG. 24 is an enlarged cross-sectional view illustrating a configuration in the vicinity of a terminal part of a semiconductor device according to an eleventh preferred embodiment.

FIG. 24 is an enlarged cross-sectional view illustrating a configuration in the vicinity of the terminal part 12 of a semiconductor device according to the eleventh preferred embodiment. The second tip end portion 34b of each of the second external connection terminals 34 is arranged to be shifted in a direction parallel to the plane of the printed wiring board 10, corresponding to the width or thickness of the first tip end portion 24b of each of the first external connection terminals 24. Further, in the eleventh preferred embodiment, the second base end portion 34a of each of the second external connection terminals 34 is also provided to be shifted in a direction parallel to the plane of the printed wiring board 10, corresponding to the width or thickness of the first tip end portion 24b of each of the first external connection terminals 24. Both the first external connection terminal 24 and the second external connection terminal 34 penetrate through the same through hole 14, and a side surface of the second tip end portion 34b of each of the second external connection terminals 34 is in contact with a side surface of the first tip end portion 24b of each of the first external connection terminals 24. As described above, the second semiconductor module 30 is connected in parallel to the first semiconductor module 20 such that the second tip end portion 34b is in contact with a side surface of the first tip end portion 24b of each of the first external connection terminals 24 via each of the terminal parts 12 of the printed wiring board 10. Each of the first external connection terminals 24 and each of the second external connection terminals 34 may be connected while penetrating through holes that are different from each other.

With such a configuration, the second semiconductor module 30 is disposed opposite to the first semiconductor module 20 without having an offset with respect to the first semiconductor module 20. Wiring patterns including power wiring and control wiring do not intersect but connect the respective terminals. The size of the printed wiring board 10 is reduced, and the heat generated in each of the semiconductor modules is efficiently radiated from both sides of the semiconductor device.

In the present invention, the respective preferred embodiments can be freely combined or appropriately modified or omitted within the scope of the present invention.

While the invention has been shown and described in detail, the foregoing description is in all aspects illustrative and not restrictive. It is therefore understood that numerous modifications and variations can be devised without departing from the scope of the invention.

What is claimed is:
1. A semiconductor device comprising:
   a printed wiring board;
   a first semiconductor module including a first package body and a first heat radiation surface, the first package body including a first semiconductor element, the first heat radiation surface being provided at one surface of the first package body and configured to radiate heat generated in the first semiconductor element, the first semiconductor module being disposed such that another surface of the first package body, opposite to the first heat radiation surface, faces one face of the printed wiring board;
   a first heat radiator provided on the first heat radiation surface of the first semiconductor module;
   a second semiconductor module including a second package body and a second heat radiation surface, the second package body including a second semiconductor element, the second heat radiation surface being provided at one surface of the second package body and configured to radiate heat generated in the second semiconductor element, the second semiconductor module being disposed such that another surface of the second package body, opposite to the second heat radiation surface, faces another face of the printed wiring board; and a second heat radiator provided on the second heat radiation surface of the second semiconductor module, wherein the first semiconductor module and the second semiconductor module are arranged to overlap each other in a plan view, the second semiconductor module is connected in parallel to the first semiconductor module, the printed wiring board includes a plurality of terminal parts, the first semiconductor module includes a plurality of first external connection terminals each provided to protrude from the first package body and connected to the first semiconductor element, the second semiconductor module includes a plurality of second external connection terminals each provided to protrude from the second package body and connected to the second semiconductor element, and the second semiconductor module is connected in parallel to the first semiconductor module such that each of the second external connection terminals is connected to each of the first external connection terminals via each of the terminal parts of the printed wiring board.

2. The semiconductor device according to claim 1, wherein each of the first external connection terminals includes a first base end portion on a side near the first package body and a first tip end portion protruding in a direction from the first base end portion, each of the second external connection terminals includes a second base end portion on a side near the second package body and a second tip end portion protruding in a direction from the second base end portion, the first base end portion of each of the first external connection terminals and the second base end portion of each of the second external connection terminals are arranged in a mirror image positional relation, and the second tip end portion of each of the second external connection terminals is connected to the first tip end portion of each of the first external connection terminals via each of the terminal parts of the printed wiring board.

3. The semiconductor device according to claim 2, wherein the second tip end portion of each of the second external connection terminals is nested with respect to the first tip end portion of each of the first external connection terminals.

4. The semiconductor device according to claim 2, wherein at least one of each of the first external connection terminals and each of the second external connection terminals includes a press-fit terminal.

5. The semiconductor device according to claim 2, wherein at least one of each of the first external connection terminals and each of the second external connection terminals includes a spring terminal.

6. The semiconductor device according to claim 2, wherein at least one of each of the first external connection terminals and each of the second external connection terminals includes a plate-shaped terminal that is bent in parallel with the printed wiring board and is in surface contact with each of the terminal parts.

7. The semiconductor device according to claim 6, wherein each of the second external connection terminals includes a plate-shaped terminal that is bent inward of the second semiconductor module and is in surface contact with each of the terminal parts of the printed wiring board, and the second tip end portion of each of the second external connection terminals is nested with respect to the first tip end portion of each of the first external connection terminals.

8. The semiconductor device according to claim 2, wherein the printed wiring board includes a through hole in each of the terminal parts, at least one of each of the first external connection terminals and each of the second external connection terminals penetrates the through hole, and the second tip end portion of each of the second external connection terminals is connected to the first tip end portion of each of the first external connection terminals.

9. The semiconductor device according to claim 8, wherein each of the second external connection terminals includes a recessed shape in the second tip end portion, and each of the first external connection terminals includes, in the first tip end portion, a protruding shape to be fitted to the recessed shape of the second tip end portion.

10. The semiconductor device according to claim 9, wherein the recessed shape is a hole or a bifurcated slit.

11. The semiconductor device according to claim 8, wherein each of the second external connection terminals includes an L shape in the second tip end portion, and in each of the first external connection terminals, the first tip end portion is in contact with a bottom surface or a side surface of the L shape of the second tip end portion.

12. The semiconductor device according to claim 8, wherein each of the second external connection terminals includes a tapered shape in the second tip end portion, and each of the first external connection terminals includes, in the first tip end portion, a tapered shape to be in contact with the tapered shape of the second tip end portion.

13. The semiconductor device according to claim 1, wherein each of the first external connection terminals includes a first tip end portion protruding in a direction from the first package body, each of the second external connection terminals includes a second tip end portion protruding in a direction from the second package body, the second tip end portion of each of the second external connection terminals is disposed to be shifted in a direction parallel to a plane of the printed wiring board, corresponding to a width or a thickness of the first tip end portion of each of the first external connection terminals, and the second tip end portion is in contact with a side surface of the first tip end portion of each of the first external connection terminals via each of the terminal parts of the printed wiring board.

* * * * *